United States Patent [19]

Tanigawa

[11] Patent Number: 4,888,772
[45] Date of Patent: Dec. 19, 1989

[54] TESTING CIRCUIT FOR RANDOM ACCESS MEMORY DEVICE

[75] Inventor: Takaho Tanigawa, Tokyo, Japan

[73] Assignee: NEC Corporation, Tokyo, Japan

[21] Appl. No.: 66,275

[22] Filed: Jun. 25, 1987

[30] Foreign Application Priority Data

Jun. 25, 1986 [JP] Japan .................................. 61-150347

[51] Int. Cl.⁴ ............................................. G06F 11/00
[52] U.S. Cl. ..................................... 371/21.2; 371/27
[58] Field of Search ......................... 371/21, 10, 8, 11; 365/200, 201

[56] References Cited

U.S. PATENT DOCUMENTS

| | | | |
|---|---|---|---|
| 4,670,878 | 6/1978 | Childers | 371/21 |
| 4,701,919 | 10/1987 | Naitol | 371/21 |
| 4,730,318 | 3/1988 | Bogholtz | 371/21 |

Primary Examiner—Michael F. Fleming
Attorney, Agent, or Firm—Sughrue, Mion, Zinn, Macpeak & Seas

[57] ABSTRACT

In a semiconductor random access memory device of the type having two or more data lines arranged in association with a single data input or output terminal is provided a memory testing circuit which is characterized in that test data is supplied to every one of the data lines and is written all at a time into a plurality of memory cells which may include those located adjacent each other, wherein the number of the memory cells into which test data is to be written simultaneously depends on the data lines to be selected so that different pieces of data can be respectively written into the individual memory cells. A portion of an address signal is used not for the selection of the memory cells during the test data write cycle of the testing operation but for controlling the inversion of the test data to be written into selected ones of the memory cells and is supplied to the memory cells associated with any one or more of the data lines, whereby pieces of data complementary to each other can be supplied to the adjacent memory cells respectively through two of the data lines, providing a basis on which an interference test can be conducted for the memory cells located adjacent each other.

8 Claims, 6 Drawing Sheets

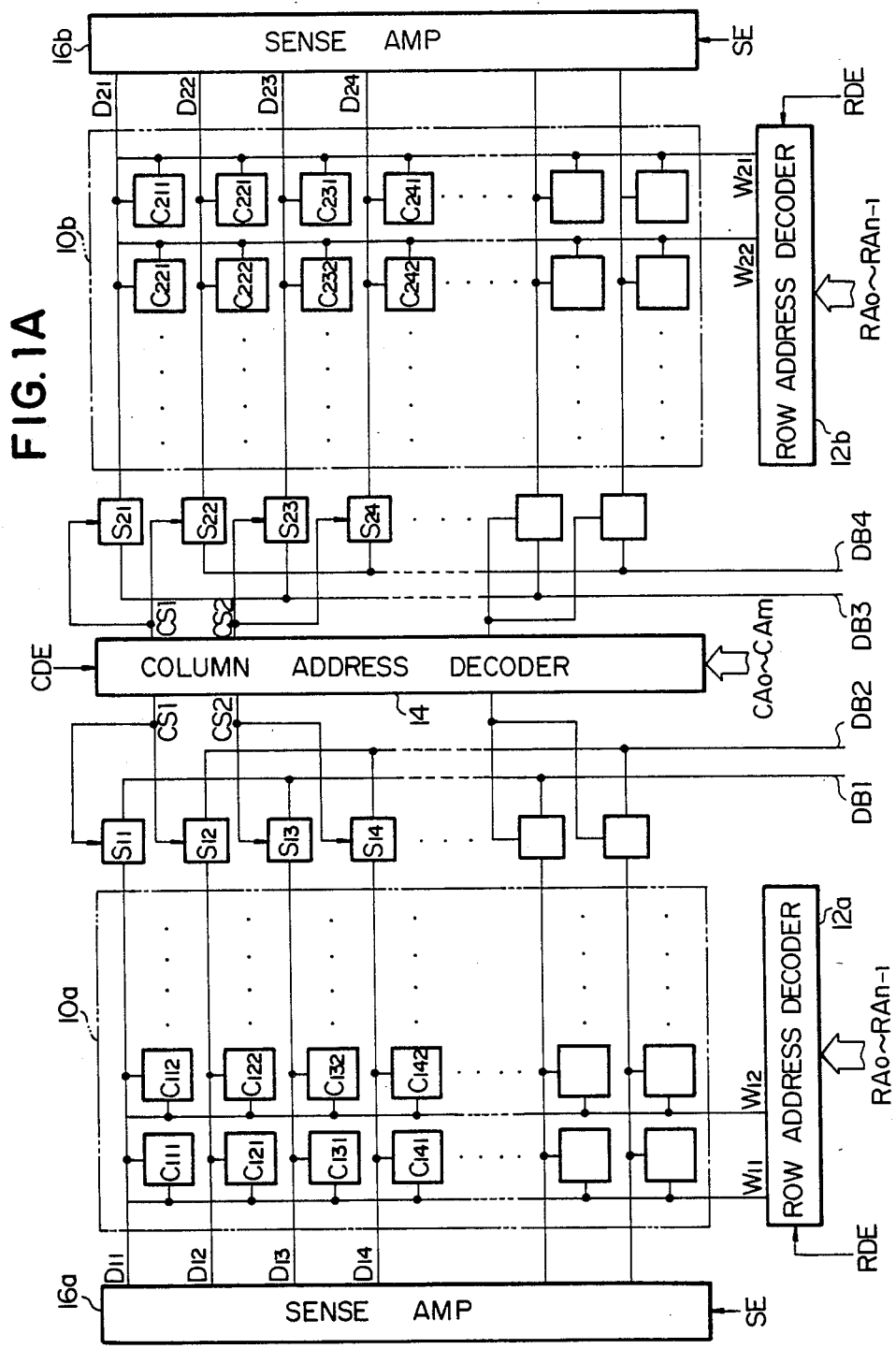

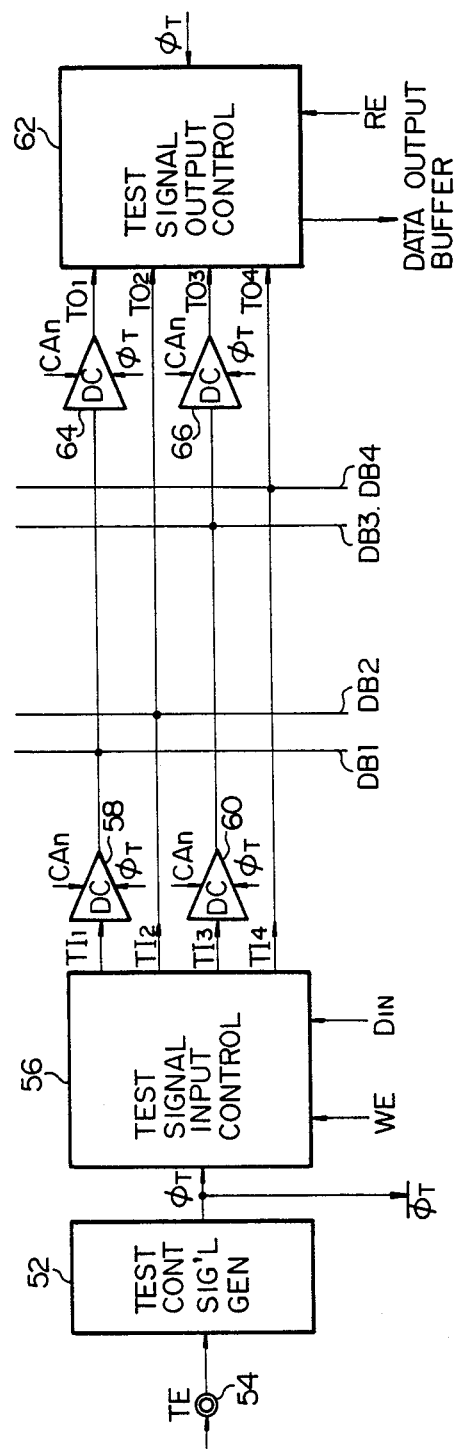

TESTING CIRCUIT FOR RANDOM ACCESS MEMORY DEVICE

FIELD OF THE INVENTION

The present invention relates in general to semiconductor memory devices and, particularly, to a semiconductor random access memory device from which data can be read and into which data can be written. More particularly, the present invention relates to a memory testing circuit for use in such a read/write memory device.

BACKGROUND OF THE INVENTION

As well known in the art, a semiconductor random access read/write memory device largely consists of a memory cell array composed of a number of memory cells arranged in rows and column in the form of a matrix, cell selector means to select at least one of the memory cells in response to supplied row and column address signals, means by which data is to be written into the selected memory cell, and means by which the data thus written into the selected cell is to be read from the memory cell. In a read/write memory of this type, two or more data lines are provided commonly for a single data input or output terminal and the cell selector means selects one of the rows of the memory array in response to the supplied row address signal. The cell selector means is further responsive to a portion of the supplied column address signal to specify two or more memory cells which are associated with particular two or more of the data lines and which have been selected in response to the row address signal. In response to the remaining portion of the column address signal, the selector means selects one of the selected two or more data lines so that only one memory cell is finally selected which is associated with both the selected data line and the selected row line. Data is written into or read out of the single particular memory cell through the data line with which the memory cell is associated.

In the meantime, a semiconductor read/write memory device of any type must be tested to see whether or not the individual memory cells and the various peripheral circuits of the device operate properly. For this purpose, test data is written into each of all the memory cells provided in the device and thereafter the data thus written into the individual memory cells is read out from every memory cell for comparison with the original data to see if the data read out from each memory cell is correctly in agreement with the original data. Major requirements of such a testing scheme include reduction of the period of time necessitated for the testing and the flexibility in nature of the data which can be used for testing purposes. For the testing of a memory device in which two or more memory cells are to be selected all at a time in response to row and column address signals, a testing circuit is used which is provided with a test data input circuit from which test data is to be supplied to each of the two or more data lines and is written concurrently into both or all of the selected memory cells connected to the data lines. This type of memory testing circuit contributes at least to significantly reducing the period of time required to carry out the test because of the fact that test data is written all at a time into a number of memory cells which are selected collectively.

A prior-art memory testing circuit of the type described however has an important drawback which stems from the fact that the two or more memory cells into which data is to be written for testing purposes receive only one and the same data from the testing circuit. The same data being used for both or all of the memory cells which are located adjacent each other, an interference test could not be conducted for those memory cells located adjacent each other. As well known in the art, this interference test is performed to see if the data stored in at least one of adjacent two memory cells might have been destroyed due to the capacitive coupling which might have been induced between the cells.

It is, accordingly, an important object of the present invention to provide a memory testing circuit useful for testing a semiconductor random access memory device in a significantly reduced period of time and with use of any desired kind of test data.

It is another important object of the present invention to provide an improved memory testing circuit capable of testing a semiconductor random access memory device in respect of an interference effect between adjacent memory cells of the device while offering significant reduction in the period of time required for the testing of the device.

Yet, it is another important object of the present invention to provide a semiconductor random access memory device incorporating an improved built-in memory testing circuit capable of performing an interference test for the memory cell array of the device.

SUMMARY OF THE INVENTION

To accomplish these objects in a semiconductor random access read/write memory device of the type having two or more data lines provided in association with a single data input or output terminal, a memory testing circuit is hereby proposed which is characterized in that test data is supplied to every one of the data lines provided in the device and is written into a plurality of memory cells which may include those located adjacent each other. Thus, test data is written into a plurality of memory cells of the array all at a time during write cycle of the testing operation in contrast to the data write cycle of the ordinary memory operation. The number of the memory cells into which test data is to be written simultaneously depends on the data lines to be selected and, for this reason, different pieces of data can be respectively written into the individual memory cells.

In a testing circuit according to the present invention, furthermore, a portion of the column address signal is left unused for the selection of the memory cells during the test data write cycle of the testing operation. The test data to be written into selected ones of the memory cells may thus be inverted under the control of such a portion of the column address signal and supplied to the memory cells associated with any one or more of the data lines. In this fashion, true test data may be supplied to one of adjacent two memory cells through one of the two or more data lines with complementary test data supplied to the other of the adjacent cells through another data line. Mutually complementary pieces of data being thus supplied to the adjacent memory cells respectively through two of the data lines, one of the adjacent memory cells receives and has retained therein a piece of data distinct from that received and retained by the other. This provides a basis on which an interference test can be conducted for the memory cells located adjacent each other. Thus, not only there can be achieved significant reduction in the period of time required for the writing of test data and accordingly for the testing of the memory device but also an interference test between adjacent two memory cells can be effected easily and accurately by means of the memory testing circuit.

In accordance with the present invention, there is thus provided a memory testing circuit for a semiconductor random access memory device including (a) a memory cell array consisting essentially of a number of memory cells arranged in rows and columns, (b) at least two data lines operatively connected to the memory cell array, (c) first selector means responsive to a portion of a supplied address signal for selecting at least two of the memory cells from the memory cell array and coupling the selected at least two memory cells respectively to the at least two data lines, and (d) second selector means responsive to the remaining portion of the supplied address signal for selecting one of the at least two data lines and supplying to the selected data line the data to be written into the memory cell which is selected out of the selected at least two memory cells and which is connected to the selected single data line, wherein the memory testing circuit is operative supply test data to and writes the test data into every one of the memory cells of the array without use of the second selector means.

BRIEF DESCRIPTION OF THE DRAWINGS

The features and advantages of a semiconductor memory memory testing circuit according to the present invention will be more clearly appreciated from the following description taken in conjunction with the accompanying drawings in which:

FIG. 1A is a block diagram showing a circuit portion of a semiconductor read/write memory device incorporating a preferred embodiment of a memory memory testing circuit according to the present invention;

FIG. 1B is a block diagram showing another circuit portion of the read/write memory partly illustrated in FIG. 1A, the circuit portion forming the preferred embodiment of a memory memory testing circuit according to the present invention;

DESCRIPTION OF THE PREFERRED EMBODIMENT

Figure 1C:
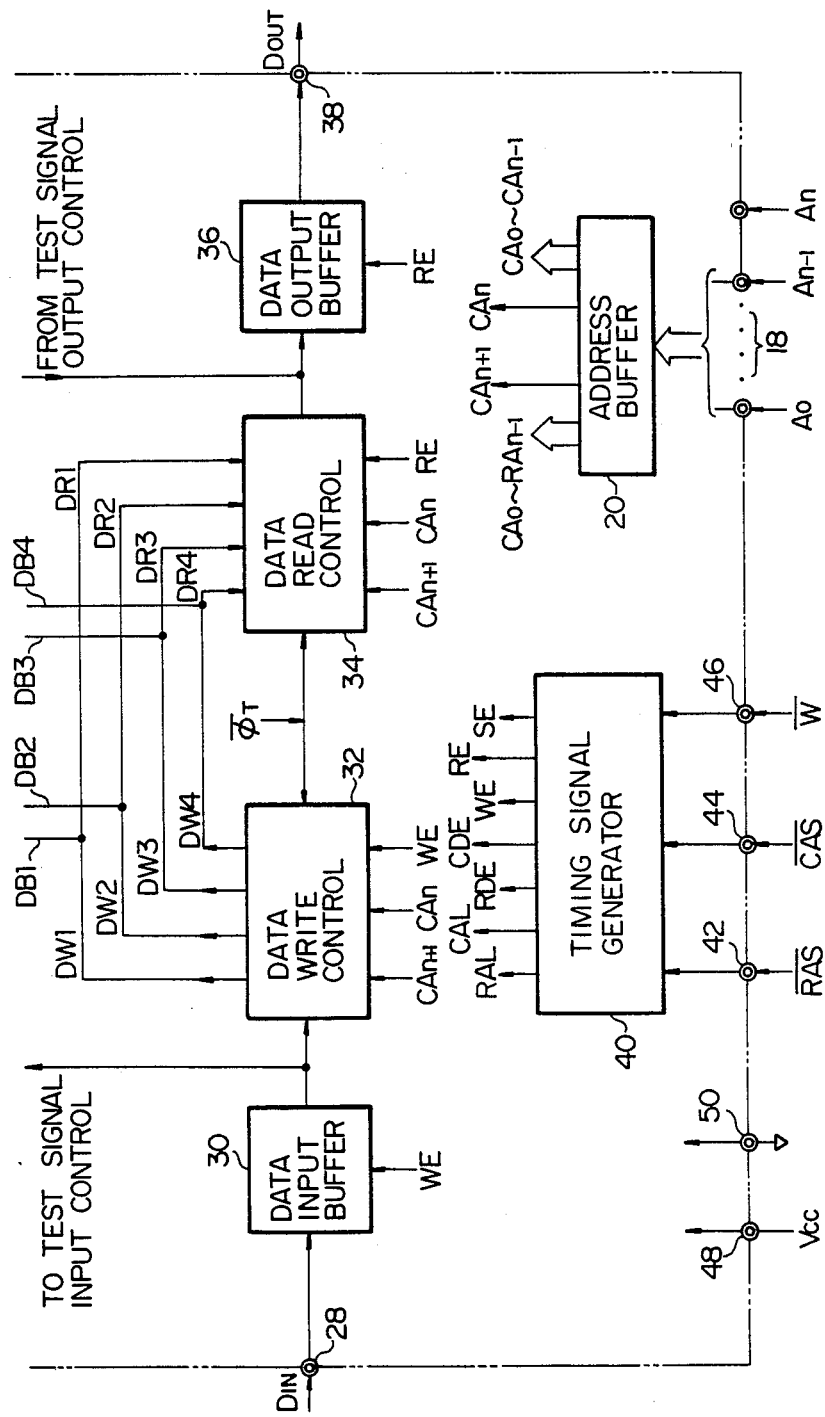
FIG. 1C is a block diagram showing still another circuit portion of the read/write memory partly illustrated in FIGS. 1A and 1B.

Description will be hereinafter made with reference to the drawings in regard to the construction and arrangement of a preferred embodiment of a memory testing circuit according to the present invention.

A random access read/write memory device of the type to which the present invention generally appertains is typically implemented by an integrated circuit fabricated on a semiconductor chip. Referring to the drawings, first particularly to FIG. 1A, such a memory device comprises a memory cell array which is broken down to separate two array sections which consist of first and second cell blocks $10a$ and $10b$, respectively, formed on the semiconductor chip. These two cell blocks $10a$ and $10b$ are per se similar in construction and arrangement, each composed of a number of memory cells arranged in rows and columns respectively along row or word lines which are shown running vertically and column or bit lines which are shown running horizontally.

In the memory cell array herein shown, the first cell block $10a$ comprises memory cells $C_{111}$, $C_{112}$, ... arranged along a bit line $D_{11}$; memory cells $C_{121}$, $C_{122}$, ... arranged along a bit line $D_{12}$; memory cells $C_{131}$, $C_{132}$, ... arranged along a bit line $D_{13}$; memory cells $C_{141}$, $C_{142}$, ... arranged along a bit line $D_{14}$ and so on. Of these memory cells of the first cell block $10a$, the memory cells $C_{111}$, $C_{121}$, $C_{131}$, $C_{141}$, ... are arranged along a word line $W_{11}$, and the memory cells $C_{112}$, $C_{122}$, $C_{132}$, $C_{142}$, ... are arranged along a word line $W_{12}$. Similarly, the second cell block $10b$ of the memory cell array comprises memory cells $C_{211}$, $C_{212}$, arranged along a bit line $D_{21}$; memory cells $C_{221}$, $C_{222}$, arranged along a bit line $D_{22}$; memory cells $C_{231}$, $C_{232}$, arranged along a bit line $D_{23}$; memory cells $C_{241}$, $C_{242}$, ... arranged along a bit line $D_{24}$; and so on. Of these memory cells of the second cell block $10b$, the memory cells $C_{211}$, $C_{221}$, $C_{231}$, $C_{241}$, ... are arranged along a word line $W_{21}$, and the memory cells $C_{212}$, $C_{222}$, $C_{232}$, $C_{242}$, ... are arranged along a word line $W_{22}$, as shown. As well known in the art, each of these memory cells of the cell blocks $10a$ and $10b$ is typically of the single-transistor single-capacitor design and is composed of a MOS (metal oxide semiconductor) field-effect transistor. In a memory cell of this design, the field-effect transistor has its gate connected to the associated one of the word lines and one of the source and drain connected to the associated one of the bit lines with the other of the source and drain connected to a reference voltage source such as ground across the capacitor, though not shown.

The word lines $W_{11}$, $W_{12}$, ... and bit lines $D_{11}$, $D_{12}$, ... of the first cell block $10a$ are connected to a first row decoder $12a$ and to a first sense amplifier $16a$ and, likewise, the word lines $W_{21}$, $W_{22}$, ... and bit lines $D_{21}$, $D_{22}$, ... of the second cell block $10b$ are connected to a second row decoder $12b$ and to a second sense amplifier $16b$ as shown, each of the row decoders $12a$ and $12b$ having address input terminals and a control terminal as is customary. On the other hand, the odd-number bit through gated bit line selector switches $S_{11}$, $S_{13}$, ..., respectively, to a first data bus line $DB_1$ and the even-number bit lines $D_{12}$, $D_{14}$, ... of the cell block $10a$ are connected through gated bit line selector switches $S_{12}$, $S_{14}$, ..., respectively, to a second data bus line $DB_2$. Likewise, the odd-number bit lines $D_{21}$, $D_{23}$, ... of the second cell block $10b$ are connected through gated bit line selector switches $S_{21}$, $S_{23}$, ..., respectively, to a third data bus line $DB_3$ and the even-number bit lines $D_{22}$, $D_{24}$, ... of the cell block $10b$ are connected through gated bit line selector switches $S_{22}$, $S_{24}$, ..., respectively, to a fourth data bus line $DB_4$. Each of the bit line selector switches $S_{11}$, $S_{12}$, $S_{13}$, $S_{14}$, ... and $S_{21}$, $S_{22}$, $S_{23}$, $S_{24}$, ... thus provided as a gating or control terminal. The respective control terminals of the bit line selector switches $S_{11}$, $S_{12}$, $S_{13}$, $S_{14}$, ... and the respective control terminals of the bit line selector switches $S_{21}$, $S_{22}$, $S_{23}$, $S_{24}$, are connected to a common column decoder 14.

In the read/write memory device to which the present invention generally appertains, the individual bit lines of each of the first and second cell blocks 10a and 10b are arranged in pairs each consisting of a pair of adjacent bit lines, such as a pair of adjacent bit lines $D_{11}$ and $D_{12}$ and a pair of adjacent bit lines $D_{13}$ and $D_{14}$ of the first cell block 10a, or a pair of adjacent bit lines $D_{21}$ and $D_{22}$ and a pair of adjacent bit lines $D_{23}$ and $D_{24}$ of the second cell block 10b. In each of the first and second cell blocks 10a and 10b, furthermore, one of the two bit lines of each of the plurality of bit line pairs is connected to one data bus line across the bit line selector switch associated with the particular bit line and, likewise, the other of the two bit lines of each bit line pair is connected to another data bus line across the bit line selector switch associated with the particular bit line. Thus, one set of alternate ones of all the bit lines of each of the first and second cell blocks 10a and 10b are jointly connected to one of the first to fourth data bus lines $DB_1$ to $DB_4$ across the bit line selector switches respectively associated with the particular bit lines and the other set of alternate ones of all the bit lines of each cell block are jointly connected to another data bus line across the bit line selector switches respectively associated with the particular bit lines. In addition, the bit line selector switches $S_{11}$, $S_{12}$, $S_{13}$, $S_{14}$, ... and $S_{21}$, $S_{22}$, $S_{23}$, $S_{24}$, ... associated with the first and second cell blocks 10a and 10b are connected to the column address decoder 14 in such a manner that the switches for each pair of adjacent bit lines have their control terminals connected to each of the output terminals of the decoder 14. Thus, a total of four bit line switches which consist of the switches $S_{11}$ and $S_{12}$ associated with one pair of adjacent bit lines $D_{11}$ and $D_{12}$ of the first cell block 10a and the switches $S_{21}$ and $S_{22}$ associated with one pair of adjacent bit lines $D_{21}$ and $D_{22}$ of the second cell block 10b are connected to a first output terminal of the column decoder 14 and receive a first common bit line select signal $CS_1$ from the decoder 14. In a like manner, a total of four bit line switches which consist of the switches $S_{13}$ and $S_{14}$ associated with another pair of adjacent bit lines $D_{13}$ and $D_{14}$ of the first cell block 10a and the switches $S_{23}$ and $S_{24}$ associated with another pair of adjacent bit lines $D_{23}$ and $D_{24}$ of the second cell block 10b are connected to a second output terminal of the column decoder 14 and receive a second common bit line select signal $CS_2$ from the decoder 14.

In the memory device herein shown, an address signal $A_0 \ldots A_n$ originating externally of the memory device is supplied in the form of parallel bits to address input terminals 18 of the semiconductor chip as shown in FIG. 1C. The supplied address signal $A_0 \ldots A_n$ composed of the n+1 number of bits is passed to each of an address buffer 20 having first and second control terminals in addition to an n+1 number of parallel address input terminals.

Upon receipt of the address signal $A_0 \ldots A_n$, the address buffer 20 may produce a row address signal $RA_0 \ldots RA_{n-1}$ composed of an n number of bits resulting respectively from the bits $A_0$ to $A_n$ of the input address signal and an n+2th column address bit $CA_{n+1}$ resulting from the remaining bit $A_n$ of the input address signal $A_0 \ldots A_n$ row address signal $RA_0 \ldots RA_{n-1}$ thus output from the address buffer 20 is transferred to the first and second row address decoders 12a and 12b through an address bus and branch address buses (FIG. 1A), while the n+2th column address bit $CA_{n-1}$ resulting from the bit $A_n$ of the input address signal $A_0 \ldots A_n$ is latched within the address buffer 20. In response to the address signal $A_0 \ldots A_n$ thereafter supplied to the address buffer 20, the address buffer 20 may alternatively produce an n+1 number of column address bits $CA_0$ to $CA_n$ resulting respectively from the bits $A_0$ to $A_n$ of the input address signal. With the column address bits $CA_0$ to $CA_n$ thus produced, the address buffer 20 now has an n+2 number of column address bis $CA_0$ to $CA_{n+1}$ including the n+2th column address bit $CA_{n-1}$ which has been latched in the address buffer 20. Of these column address bis $CA_0$ to $CA_{n+1}$ thus possessed by the address buffer 20, the address bits $CA_0$ to $CA_{n-1}$ are supplied as a column address signal $CA_0 \ldots CA_{n-1}$ to the column address decoder 14 through an address bus. The remaining address bits $CA_{n-1}$ and $CA_n$ are used respectively as first and second data bus line address signals for the control of data write operation as will be described in more detail.

To the semiconductor chip carrying the memory device under consideration is further supplied from an external source (not shown) an input data signal $D_{IN}$ representative of the data to be written into the memory cell array. The input data signal $D_{IN}$ is transmitted to a data input terminal 28 of the chip and is input from the terminal 28 to a data input buffer 30 shown in FIG. 1B. The data input buffer 30 has a control terminal and is operative to pass the input data signal $D_{IN}$ to a data write control circuit 32 when enabled through the control terminal. The data write control circuit 32 has first and second control terminals respectively responsive to the first and second data bus line address signals $CA_{n+1}$ and $CA_n$ supplied from the row and column buffers 20 and 22, respectively, and further has four, first to fourth output terminals $DW_1$, $DW_2$, $DW_3$ and $DW_4$ connected to the first to fourth data bus lines $DB_1$, $DB_2$, $DB_3$ and $DB_4$, respectively. The data write control circuit 32 further has a third control terminal and, when enabled through the third control terminal, selects any one of the first to fourth data bus lines $DB_1$, $DB_2$, $DB_3$ and $DB_4$ depending on the respective logic states of the supplied first and second data bus line address signals $CA_{n+1}$ and $CA_n$. Thus, the data signal representative of the data to be written into the memory cell array, viz., either the first cell block 10a or the second cell block 10b, is output through any one of the four output terminals $DW_1$, $DW_2$, $DW_3$ and $DW_4$ of the data write control circuit 32 which is connected to the selected one of the first to fourth data bus lines $DB_1$, $DB_2$, $DB_3$ and $DB_4$.

The data thus stored in one of the first and second cell blocks 10a and 10b through the selected one of the first to fourth data bus lines $DB_1$, $DB_2$, $DB_3$ and $DB_4$ is read out therefrom by means of a data read control circuit 34 through the particular data bus line. The data read control circuit 34 also has first and second control terminals respectively responsive to the first and second data bus line address signals $CA_{n+1}$ and $CA_n$ supplied from the row and column buffers 20 and 22, respectively, and further has four, first to fourth input terminals $DR_1$, $DR_2$, $DR_3$ and $DR_4$ connected to the first to fourth data bus lines $DB_1$, $DB_2$, $DB_3$ and $DB_4$, respectively. The data read control circuit 34 further has a third control terminal and, when enabled through the third control terminal, selects any one of the first to fourth data bus lines $DB_1$, $DB_2$, $DB_3$ and $DB_4$ depending on the respective logic states of the supplied first and second data bus line address signals $CA_{n+1}$ and $CA_n$. Thus, the data signal representative of the data read from the memory cell array, viz., either the first cell block $10a$ or the second cell block $10b$, is input through any one of the four input terminals $DR_1$, $DR_2$, $DR_3$ and $DR_4$ of the data read control circuit 34 which is connected to the selected one of the first to fourth data bus lines $DB_1$, $DB_2$, $DB_3$ and $DB_4$. The data signal thus input to the data read control circuit 34 is supplied to a data output buffer 36. The data output buffer 36 has a control terminal and is operative to pass the output data signal to a data output terminal 38 of the chip and is sent out from the chip as an output data signal $D_{OUT}$ for comparison with the original input data signal $D_{IN}$.

Various timing and enable signals are generated by and supplied from a timing signal generator 40 having input terminals respectively connected to other input terminals provided on the chip. These input terminals of the timing signal generator 40 include a first input terminal connected to a row address strobe signal input terminal 42 at which a row address strobe signal RAS— is to appear, and a second input terminal connected to a column address strobe signal input terminal 44 at which a column address strobe signal CAS— is to appear. The input terminals of the signal generator 40 further include a third input terminal connected to a write enable signal input terminal 46 at which a write enable signal W— is to appear. It may be noted that each of these signals RAS—, CAS— and W— is an active low signal which is active when swung to or remaining at a low level and is indicated, in FIG. 1C, with a bar over each of the denotations RAS, CAS and W as is customary in the art.

In response to any one or more of these signals RAS—, CAS— and W—, the timing signal generator 40 selectively produces various timing signals which include a first address latch signal 1AL, a second address latch signal 2AL, a row decoder enable signal RDE, a column decoder enable signal CDE, a write control signal WE, a read control signal RE, and a sense amplifier enable signal SE. Of these various timing and enable signals, the first address latch signal 1AL is supplied to the first control terminal of the address buffer 20, while the second address latch signal 2AL is supplied to the second control terminal of the address buffer 20. The row decoder enable signal RDE is supplied to the control terminal of each of the first and second row address decoders $12a$ and $12b$, while the column decoder enable signal CDE is supplied to the control terminal of the column address decoder 14. The write control signal WE is supplied to the control terminal of the data input buffer 30 and to a third control terminal of the data write control circuit 32, while the read control signal RE is supplied to the control terminal of the data output buffer 36 and to a third control terminal of the data read control circuit 34. The sense amplifier enable signal SE is supplied to the control terminal of each of the first and second sense amplifiers $116a$ and $16b$. Each of these timing and enable signals 1AL, 2AL, RDE, CDE, WE, RE, and SE to be produced by the timing signal generator 40 is an active high signal which is active when swung to or remaining at a high level.

The semiconductor chip carrying the memory device under consideration further has a voltage supply terminal 48 for the supply of an appropriate high-level supply voltage $V_{cc}$ of typically 5 volts and a voltage supply terminal 50 for the supply of an appropriate low-level supply voltage of typically ground level. The circuit arrangement of each of the component circuits of the read/write memory device as hereinbefore described is well known in the art and, for this reason, no further description as to the details of such circuits will be herein incorporated.

Description will be hereinafter made with concurrent reference to FIGS. 1A and 1C in regard to the ordinary data write and read modes of operation of the memory device thus constructed.

Now, for ordinary data write or read mode of operation, the active-low row address strobe signal RAS— appearing at the terminal 44 of the chip swings from high level to low level. In response to the row address strobe signal RAS— of low level, the timing signal generator 40 supplies the first address latch signal 1AL to the first control terminal of the address buffer 20. The address buffer 20 is thus activated to have latched therein the address signal $A_0 \ldots A_n$ of the $n+1$ number of bits appearing at the input terminals 18 of the chip and produces an n bit row address signal $RA_0 \ldots RA_{n-1}$ and the first data bus line address signal $CA_{n+1}$. The row address signal $RA_0 \ldots RA_{n-1}$ is supplied to the input terminals of the first and second row address decoders $12a$ and $12b$. The first data bus line address signal $CA_{n+1}$ is transmitted to the first control terminal of each of the data write and read control circuits 32 and 34.

From the timing signal generator 40 is further output the row decoder enable signal RDE, which is transmitted to the control terminal of each of the first and second row address decoders $12a$ and $12b$. Enabled by the row address enable signal RDE and in response to the row address signal $RA_0 \ldots RA_{n-1}$ from the address buffer 20, the first row address decoder $12a$ selects and activates one of the word lines $W_{11}$, $W_{12}$, ... of the first cell block $10a$ and likewise the second row address decoder $12b$ selects and activates one of the word lines $W_{21}$, $W_{22}$, ... of the second cell block $10b$. For purposes of discussion, the word lines thus selectively activated by the row address decoders $12a$ and $12b$ in the current write/read cycle may be assumed to be the word line $W_{11}$ in the first cell block $10a$ and the word line $W_{21}$ in the second cell block $10b$. In the first cell block $10a$ are thus designated the memory cells $C_{111}$, $C_{121}$, $C_{131}$, $C_{141}$, ... located along the word line $W_{11}$ and in the second cell block $10b$ are designated the memory cells $C_{211}$, $C_{221}$, $C_{231}$, $C_{241}$, ... located along the word line $W_{21}$. Accordingly, the pieces of data which have been stored in the memory cells $C_{111}$, $C_{121}$, $C_{131}$, $C_{141}$, ... appear on the bit lines $D_{11}$, $D_{12}$, $D_{13}$, $D_{14}$, ..., respectively, in the first cell block $10a$ and the pieces of data which have been stored in the memory cells $C_{211}$, $C_{221}$, $C_{231}$, $C_{241}$, ... located along the word line $W_{21}$ appear on the bit lines $D_{21}$, $D_{22}$, $D_{23}$, $D_{24}$, ..., respectively, in the second cell block $10b$.

From the timing signal generator 40 is further supplied the sense amplifier enable signal SE, which is transmitted to the control terminal of each of the first and second sense amplifiers $16a$ and $16b$. With the first and second sense amplifiers $16a$ and $16b$ thus activated by the sense amplifier enable signal SE, the pieces of data appearing on the bit lines $D_{11}$, $D_{12}$, $D_{13}$, $D_{14}$, ..., respectively, in the first cell block $10a$ and the pieces of data appearing on the bit lines $D_{21}$, $D_{22}$, $D_{23}$, $D_{24}$, ... in the second cell block $10b$ and are amplified and restored, viz., refreshed, in the memory cells in which they have respectively originate.

After transition of the row address strobe signal RAS_ to low level, the column address strobe signal CAS_ also swings from high level to low level. In response to the column address strobe signal CAS_ of low level, the timing signal generator 40 further outputs the second address latch signal 2AL, which is transferred to the second control terminal of the address buffer 20. The address buffer 20 is thus activated to have latched therein the address signal $A_0 \ldots A_n$ newly appearing at the input terminals 18 of the chip and produces the column address signal $CA_0 \ldots CA_{n-1}$ and the second data bus line address signal $CA_n$. The column address signal $CA_0 \ldots CA_{n-1}$ is supplied to the input terminals of the column address decoder 14 while the second data bus line address signal $CA_n$ is transmitted to the second control terminal of each of the data write and read control circuits 32 and 34. From the timing signal generator 40 is further output the column decoder enable signal CDE, which is transmitted to the control terminal of the column address decoder 14. Enabled by the column address enable signal CDE and in response to the column address signal $CA_0 \ldots CA_{n-1}$ from the address buffer 20, the column address decoder 14 selects one of the bit line select signals $CS_1$, $CS_2, \ldots$ and causes the selected signal to swing from low level to high level. For purposes of discussion, the bit line select signal thus selectively shifted to high level in the current write/read cycle may be assumed to be the bit line select signal $CS_1$. With the bit line select signal $CS_1$ thus selected, the bit line selector switches $S_{11}$ and $S_{12}$ in particular are selected out of the shown switches associated with the first cell block 10a and the bit line selector switches $S_{21}$ and $S_{20}$ in particular are selected out of the shown switches associated with the second cell block 10b. The bit line selector switches $S_{11}$, $S_{12}$, $S_{21}$ and $S_{20}$ being thus closed, the bit lines $D_{11}$ and $D_{12}$ of the first cell block 10a are connected through the switches $S_{11}$ and $S_{12}$ to the first and second data bus lines $DB_1$ and $DB_2$, respectively, and likewise the bit lines $D_{21}$ and $D_{20}$ of the second cell block 10b are connected through the switches $S_{21}$ and $S_{20}$ to the third and fourth data bus lines $DB_3$ and $DB_4$, respectively. As a consequence, the two memory cells $C_{111}$ and $C_{121}$ located along the word line $W_{11}$ and bit lines $D_{11}$ and $D_{12}$, respectively, are selected from the first cell block 10a and the two memory cells $C_{211}$, $C_{221}$ located along the word line $W_{21}$ and bit lines $D_{21}$ and $D_{20}$, respectively, are selected from the second cell block 10b. Thus, a total of four memory cells $C_{111}$, $C_{121}$, $C_{211}$ and $C_{221}$ in particular are selected and coupled to the first to fourth data bus lines $DB_1$, $DB_2$, $DB_3$ and $DB_4$, respectively, in response to the row address signal $RA_0 \ldots RA_{n-1}$ and the column address signal $CA_0 \ldots CA_{n-1}$ from the address buffer 20. As noted previously, the row address signal $RA_0 \ldots RA_{n-1}$ has resulted from a portion, viz., the bits $A_0$ to $A_{n-1}$ of the input address signal $A_0 \ldots A_n$ first supplied to the address buffer 20 and the column address signal $CA_0 \ldots CA_{n-1}$ has resulted from a portion, viz., the bits $A_0$ to $A_{n-1}$ of the input address signal $A_0 \ldots A_n$ thereafter supplied to the address buffer 20.

During ordinary data write mode of operation, the active-low write enable signal W_ appearing at the terminal 46 of the chip remains at a low level so that the active-high write and read control signals WE and RE output from the timing control circuit 40 are maintained at high and low levels, respectively. The read control signal RE being thus maintained at low level, each of the data read control circuit 34 and data output buffer 36 remains de-activated. On the other hand, each of the data input buffer 30 and data write control circuit 32 remains active with the write control signal WE maintained at high level. The input data signal $D_{IN}$ appearing at the data input terminal 28 of the chip is therefore once latched into the data input buffer 30 and is then transmitted from the buffer 30 to the data write control circuit 32. In response to the active-high write enable signal WE of high level, the data write control circuit 32 is enabled to decode the first and second data bus line address signals $CA_{n+1}$ and $CA_n$ supplied from the row and address buffer 20 and select one of the first to fourth data bus lines $DB_1$ to $DB_4$ connected to the first to fourth output terminals $DW_1$ to $DW_4$, respectively, of the control circuit 32. The selection from the data bus lines $DB_1$ to $DB_4$ is effected depending on the respective logic states of the first and second data bus line address signals $CA_{n+1}$ and $CA_n$ from the address buffer 20. The input data signal $D_{IN}$ which has been input to the data write control circuit 32 is now allowed to pass to the selected one of the first to fourth data bus lines $DB_1$ to $DB_4$ through the associated one of the output terminals $DW_1$ to $DW_4$ of the control circuit 32. For purposes of discussion, it is further assumed that, of the four data bus lines $DB_1$ to $DB_4$, the first data bus line $DB_1$ leading to the first cell block 10a is selected by the data write control circuit 32 in the current write cycle. With the first data bus line $DB_1$ thus selected, the data signal $D_{IN}$ which has been input to the data write control circuit 32 is output from the first output terminal $DW_1$ of the control circuit 32 to the selected data bus line $DB_1$ which leads to the bit line selector switches $S_{11}, S_{13}, \ldots$ associated with the first cell block 10a. As previously noted, it is herein assumed that the bit line selector switches $S_{11}$, $S_{12}$, $S_{21}$ and $S_{20}$ in particular are selected to be conductive by the bit line select signal $CS_1$ from the column decoder 14 in the current write cycle. Among these four bit line selector switches $S_{11}$, $S_{12}$, $S_{21}$ and $S_{20}$, only the switch $S_{11}$ is connected to the selected first data bus line $DB_1$. Accordingly, the input data signal $D_{IN}$ output from the data write control circuit 32 is passed through the data bus line $DB_1$ and by way of the bit line selector switch $S_{11}$ to the bit line $D_{11}$ of the first cell block 10a. It being further assumed that, in the current write cycle, the word lines $W_{11}$ and $W_{21}$ are selected from the first and second cell blocks 10a and 10b by the first and second row address decoders 12a and 12b, respectively. It therefore follows that the $C_{111}$ which is associated with both the bit line $D_{11}$ and word line $W_{11}$ is selected out of the memory cells $C_{111}$, $C_{121}, \ldots$ associated with the bit line $D_{11}$. Accordingly, the input data signal $D_{IN}$ passed to the bit line $D_{11}$ is supplied to and stored into the particular memory cell $C_{111}$ of the first cell block 10a. Of the first and second data bus line address signals $CA_{n+1}$ and $CA_n$ thus used for the selection of one of the data bus lines $DB_1$ to $DB_4$, the first bus line address signal $CA_{n+1}$ has resulted from the remaining portion, viz., the least significant bit $A_n$ of the input address signal $A_0 \ldots A_n$ first supplied to the address buffer 20 and the second bus line address signal $CA_n$ has resulted from the remaining portion, viz., the least significant bit $A_n$ of the input address signal $A_0 \ldots A_n$ thereafter supplied to the address buffer 20.

On the other hand, during ordinary data read mode of operation, the active-low write enable signal W_ appearing at the terminal 46 of the chip remains at a high level so that the active-high write and read control signals WE and RE output from the timing control circuit 40 are maintained at low and high levels, respectively. The write control signal WE being thus maintained at low level, each of the data input buffer 30 and data write control circuit 32 remains de-activated. On the other hand, each of the data read control circuit 34 and data output buffer 36 remains active with the read control signal RE maintained at high level. In response to the active-high read enable signal RE of high level, the data read control circuit 34 is enabled to decode the first and second data bus line address signals $CA_{n+1}$ and $CA_n$ from the address buffer 20 and select one of the first to fourth data bus lines $DB_1$ to $DB_4$ connected to the first to fourth input terminals $DR_1$ to $DR_4$, respectively, of the control circuit 34. The selection from the data bus lines $DB_1$ to $DB_4$ is also effected depending on the respective logic states of the first and second data bus line address signals $CA_{n+1}$ and $CA_n$ from the row and address buffers 20 and 20, respectively. For purposes of discussion, it is herein assumed that, of the four data bus lines $DB_1$ to $DB_4$, the third data bus line $DB_3$ leading from the bit line selector switches $S_{21}$, $S_{23}$, ... associated with the second cell block 10a is selected by the data read control circuit 34 in the current read cycle. As in the previously described data write cycle, it is herein assumed that the bit line selector switches $S_{11}$, $S_{12}$, $S_{21}$ and $S_{20}$ in particular are selected to be conductive by the bit line select signal $CS_1$ from the column decoder 14 in the current read cycle. Among these four bit line selector switches $S_{11}$, $S_{12}$, $S_{21}$ and $S_{20}$, only the switch $S_{21}$ is connected to the selected third data bus line $DB_3$ so that the third data bus line $DB_3$ is connected by way of the particular bit line selector switch $S_{21}$ to the bit line $D_{21}$ of the second cell block 10b. It being further assumed that, in the current read cycle, the word lines $W_{11}$ and $W_{21}$ are selected from the first and second cell blocks 10a and 10b by the first and second row address decoders 12a and 12b, respectively. It therefore follows that the $C_{211}$ which is associated with both the bit line $D_{21}$ and word line $W_{21}$ is selected out of the memory cells $C_{211}$, $C_{221}$, ... associated with the bit line $D_{21}$. Data is thus read from the particular memory cell $C_{211}$ of the second cell block 10b and the resultant data signal is passed through the bit line selector switch $S_{21}$ and by way of the third data bus line $DB_3$ to the input terminal $DR_3$ of the data read control circuit 34. Under these conditions, the data output buffer 36 is maintained active by the read control signal RE of high level so that the data signal input to the data read control circuit 34 is once latched in the data output buffer 36 and is thereafter transmitted to the data output terminal 38 of the chip for being sent out of the chip as the output data signal $D_{OUT}$.

In the read/write memory device under consideration, a particular one of the memory cells of the first and second cell blocks 10a and 10b is selected under the control of the row decoders 12a and 12b, column decoder 14 and data write or read control circuit 32 or 34 and data is written into or read from the particular memory cell during each write/read cycle of operation of the device.

In accordance with the present invention, such a read/write memory device is provided with a memory testing circuit which will make it possible to perform an interference test between adjacent two of the memory cells.

Referring to FIG. 1B, the memory testing circuit comprises a test control signal generator 52 having an input terminal connected to a test enable signal input terminal 54 of the chip. At this test enable signal input terminal 54 is to appear a test enable signal TE. The test control signal generator 52 is operative to produce a test control signal $\phi_T$ in response to the test enable signal TE of high level. The respectively embodying the present invention further comprises a test signal input control circuit 56 which has an input terminal responsive to the test control signal $\phi_T$ thus produced by the test control signal generator 52. The test signal input control circuit 56 further has a first control terminal responsive to the write control signal WE from the timing signal generator 30 and a second control terminal responsive to the input data signal $D_{IN}$ passed through the input data buffer 30 (FIG. 1C) of the memory device. The test signal input control circuit 56 further has four, first to fourth output terminals $TI_1$ to $TI_4$, of which the second and fourth output terminals $TI_2$ and $TI_4$ are connected directly to the second and fourth data bus lines $DB_2$ and $DB_4$, respectively, and the first and third output terminals $TI_1$ and $TI_3$ are connected through first and second input data control circuits 58 and 60 to the second and fourth data bus lines $DB_1$ and $DB_3$, respectively.

The test control signal $\phi_T$ produced by the test control signal generator 52 is supplied, upon being inverted into $\phi_{T-}$, to the respective fourth control terminals of the data write and read control circuits 32 and 34 (FIG. 1C) of the memory device. Throughout the test cycle in which the test enable signal TE appearing at the terminal 54 is maintained at high level, each of the data write and read control circuits 32 and 34 is deactivated by the test control signal $\phi_T$ and is thereby locked in an inoperative condition.

The memory testing circuit embodying the present invention further comprises a test signal output control circuit 62 having a control terminal responsive to the read control signal RE from the timing signal generator 30 (FIG. 1C) and a control terminal responsive to the test control signal $\phi_T$ produced by the test control signal generator 52. The test signal output control circuit 62 further has four, first to fourth input terminals $TO_1$ to $TO_4$, of which the second and fourth output terminals $TO_2$ and $TO_4$ are connected directly to the second and fourth data bus lines $DB_2$ and $DB_4$, respectively, and the first and third output terminals $TO_1$ and $TO_3$ are connected through first and second output data control circuits 64 and 66 to the second and fourth data bus lines $DB_1$ and $DB_3$, respectively. The test signal output control circuit 62 further has an output terminal connected to the input terminal of the data output buffer 36 (FIG. 1C) of the memory device.

The test enable signal TE to be supplied from the terminal 54 to the test control signal generator 52 as above described is an active-high signal and is to be maintained at low level during ordinary write/read mode of operation of the memory device. In response to the test enable signal TE of the low level, the test control signal generator 52 produces the test control signal $\phi_T$ of also low level, by means of which the test signal input control circuit 56 is de-activated as will be described in more detail.

The circuit arrangements of the test control signal generator 52, test signal input control circuit 56, data control circuits 58, 60, 64 and 66, and test signal output control circuit 62 of the memory testing circuit generally constructed as hereinbefore described are shown in FIGS. 2, 3, 4 and 5, respectively. It may be noted that, although the transistor devices included in each of these component circuits of the memory testing circuit are herein assumed to be implemented by n-type MOS field-effect transistors typically of the enhancement type, MOS field-effect transistors of another type or transistors of the bipolar type may be used in lieu of such transistor devices if desired.

Figure 2:
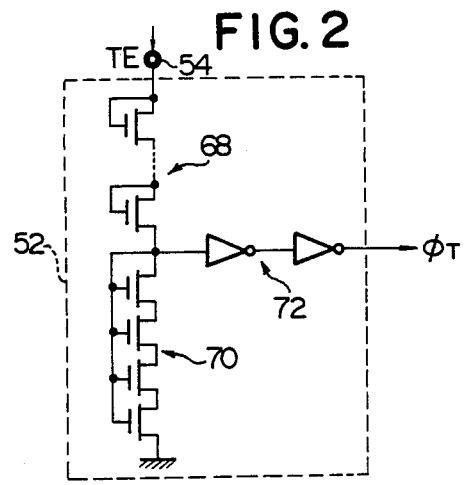
FIG. 2 is a circuit diagram showing a preferred example of a test control signal generator which forms part of the memory testing circuit illustrated in FIG. 1B.

Referring to FIG. 2, the test control signal generator 52 comprises a first series combination of transistors 68 and a second series combination of transistors 70. The first and second series combinations of transistors 68 and 70 are connected in series between the test enable signal input terminal 54 (FIG. 1B) and the low-level voltage supply terminal 50 (FIG. 1C) of the chip with an output terminal provided by a node between the two series combinations of transistors 68 and 70. Each of the first series combination of transistors 68 has its gate and drain connected together and the individual transistors 70 of the second combination have their gates commonly connected to the output terminal of the signal generator 52. Each of transistors thus forming the test control signal generator 52 functions respectively as an impedance elements so that the signal generator 52 implements a voltage divider circuit. To the output terminal of the test control signal generator 52 thus constructed is connected to a buffer circuit 72 which is shown comprised of a series combination of two inverters.

When, in operation, a signal with a voltage (of typically 12 volts) higher than the high-level supply voltage $V_{cc}$ (of typically 5 volts) appears at the terminal 54 as the test enable signal TE of high level, a voltage higher than the threshold level of the series combination of the inverters 72 appears as the test control signal $\phi_T$ of high level at the node between the first and second series combinations of transistors 68 and 70. The test control signal $\phi_T$ thus resulting from the test enable signal TE of high level establishes a testing mode of operation in the memory device including the memory testing circuit.

Figure 3:
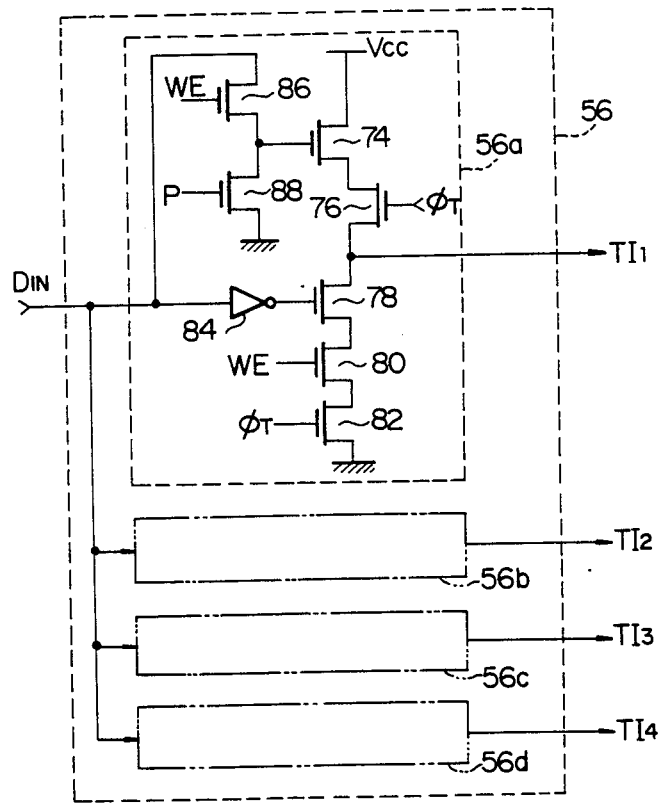
FIG. 3 is a circuit diagram showing a preferred example of a test signal input control circuit which also forms part of the memory testing circuit illustrated in FIG. 1B.

Turning to FIG. 3, the test signal input control circuit 56 of the memory testing circuit embodying the present invention is composed of four, first to fourth circuit sections 56a, 56b, 56c and 56d which are provided in association with the first to fourth output terminals $TI_1$, $TI_2$, $TI_3$ and $TI_3$, respectively, of the control circuit 56. All of these circuit sections 56a to 56d being constructed similarly, the detailed construction of only the first circuit section 56a is herein shown. The circuit section 56a comprises a series combination of transistors 74, 76, 78, 80 and 82 connected between the source (the terminal 48 shown in FIG. 1C) of the high-level supply voltage $V_{cc}$ and the source (the terminal 50 shown in FIG. 1C) of the low-level or ground voltage. The transistor 78 has its gate connected through an inverter 84 to the output terminal of the data input buffer 30 (FIG. 1C) of the memory device to receive the input data signal $D_{IN}$ transmitted through the buffer 30. The transistor 78 further has its source-drain path connected at one end to the source of the high-level supply voltage $V_{cc}$ through the respective source-drain paths of the serially connected transistors 74 and 76 and at the other to the source of the low-level or ground voltage through the respective source-drain paths of the serially connected transistors 80 and 82. Each of the transistors 76 and 82 has its gate connected to the output terminal of the test signal generator 52 (FIG. 2) and thus is responsive to the test control signal $\phi_T$ output from the circuit 52. The transistor 80 has its gate connected to one of the output terminals of the timing signal generator 30 (FIG. 1C) of the memory device and is responsive to the write enable signal WE from the signal generator 30. The transistor 74 has its gate connected to a node between serially connected two transistors 86 and 88. Of these two transistors, the transistor 86 has its source-drain path connected at one end to the transistor 88 and at the other to the output terminal of the data input buffer 30 (FIG. 1C) and is thus supplied with the input data signal $D_{IN}$. The transistor 86 further has its gate also connected to the timing signal generator 30 (FIG. 1C) and is responsive to the write enable signal WE from the signal generator 30. The transistor 88 has its source-drain path connected at one end to the transistor 86 and at the other to the source of the low-level or ground voltage. The transistor 88 is a precharge transistor which is to receive a control signal P of high level at its gate and is thus coupled to the ground voltage to precharge the node between the transistors 74 and 86 upon termination of each write/read cycle of ordinary or testing operation of the device. During each write/rear cycle of testing operation, the precharge transistor 88 is maintained in a non-conduction state. The circuit section 56a thus constructed and arranged has an output terminal implemented by the node between the transistors 76 and 78 and connected as the first output terminal $TI_1$ of the test signal input control circuit 56 to the first data bus line $DB_1$ through the first input data control circuit 58 in the arrangement shown in FIG. 1B.

Of the other circuit sections 56b, 56c and 56d of the test signal input control circuit 56, the second circuit section 56b has an output terminal connected as the second output terminal $TI_2$ of the test signal input control circuit 56 directly to the second data bus line $DB_2$ in the arrangement shown in FIG. 1B. The third circuit section 56c has an output terminal connected as the third output terminal $TI_3$ of the test signal input control circuit 56 to the third data bus line $DB_3$ through the second input data control circuit 60 in the arrangement shown in FIG. 1B. Furthermore, the fourth circuit section 56d has an output terminal connected as the fourth output terminal $TI_4$ of the test signal input control circuit 56 directly to the fourth data bus line $DB_4$ in the arrangement shown in FIG. 1B.

In the circuit section 56a of the test signal input control circuit 56 thus constructed, when the write control signal WE appearing at the gates of the transistors 80 and 86 and the test control signal $\phi_T$ appearing at the gates of the transistors 76 and 82 occur with high levels, these transistors 76, 80, 82 and 86 are all turned on. Under these conditions, the input data signal $D_{IN}$ transmitted through the data input buffer 30 (which is in a condition activated by the signal WE of high level) shown in FIG. 1C is applied through the transistor 86 to the gate of the transistor 74, which is accordingly turned on when the input data signal $D_{IN}$ occurs with a high level. The input data signal $D_{IN}$ transmitted through the data input buffer 30 is further passed to the inverter 84 and as a consequence a signal complementary to the input data signal $D_{IN}$ appears at the gate of the transistor 78. Thus, when the input data signal $D_{IN}$ remains at high level, the transistor 78 is turned off so that the output terminal of the circuit section 56a is isolated from ground. The transistor 74 being turned on with the transistor 86 turned on, the output terminal of the circuit section 56a is coupled to the high-level supply voltage $V_{cc}$ with the transistor 76 also turned on. Accordingly, a voltage level approximating the high-level supply voltage $V_{cc}$ appears at the output terminal of the circuit section 56a, viz., the first output terminal $TI_1$ of the test signal input control circuit 56. When the input data signal $D_{IN}$ occurs with a low level, the transistor 78 is turned on so that the output terminal of the circuit section 56a is connected to ground through the transistors 80 and 82 which are maintained in conduction states in the presence of the signals WE and $\phi_T$ of high levels. In the presence, furthermore, of the input data signal $D_{IN}$ of low level, the gate of the transistor 74 remains at the precharge level approximating the ground level so that the transistor 74 is turned off. With the transistor 74 thus turned off, the output terminal of the circuit section 56a is isolated from the high-level supply voltage $V_{cc}$. A voltage level approximating the ground voltage thus appears at the output terminal of the circuit section 56a, viz., the first output terminal $TI_1$ of the test signal input control circuit 56. In these manners, signals each with a high level appears at the first to fourth circuit sections 56a, 56b, 56c and 56d in the presence of the input data signal $D_{IN}$ of high level and, conversely, signals each with a low level appears at the first to fourth circuit sections 56a to 56d in the presence of the input data signal $D_{IN}$ of low level. When at least one of the write control signal WE and the test control signal $\phi_T$ remains at low level, the respective output terminals $TI_1$ to $TI_4$ of the circuit sections 56a to 56d are disconnected from both the high-level supply voltage $V_{cc}$ and ground voltage and are all maintained in high impedance states.

Figure 4:
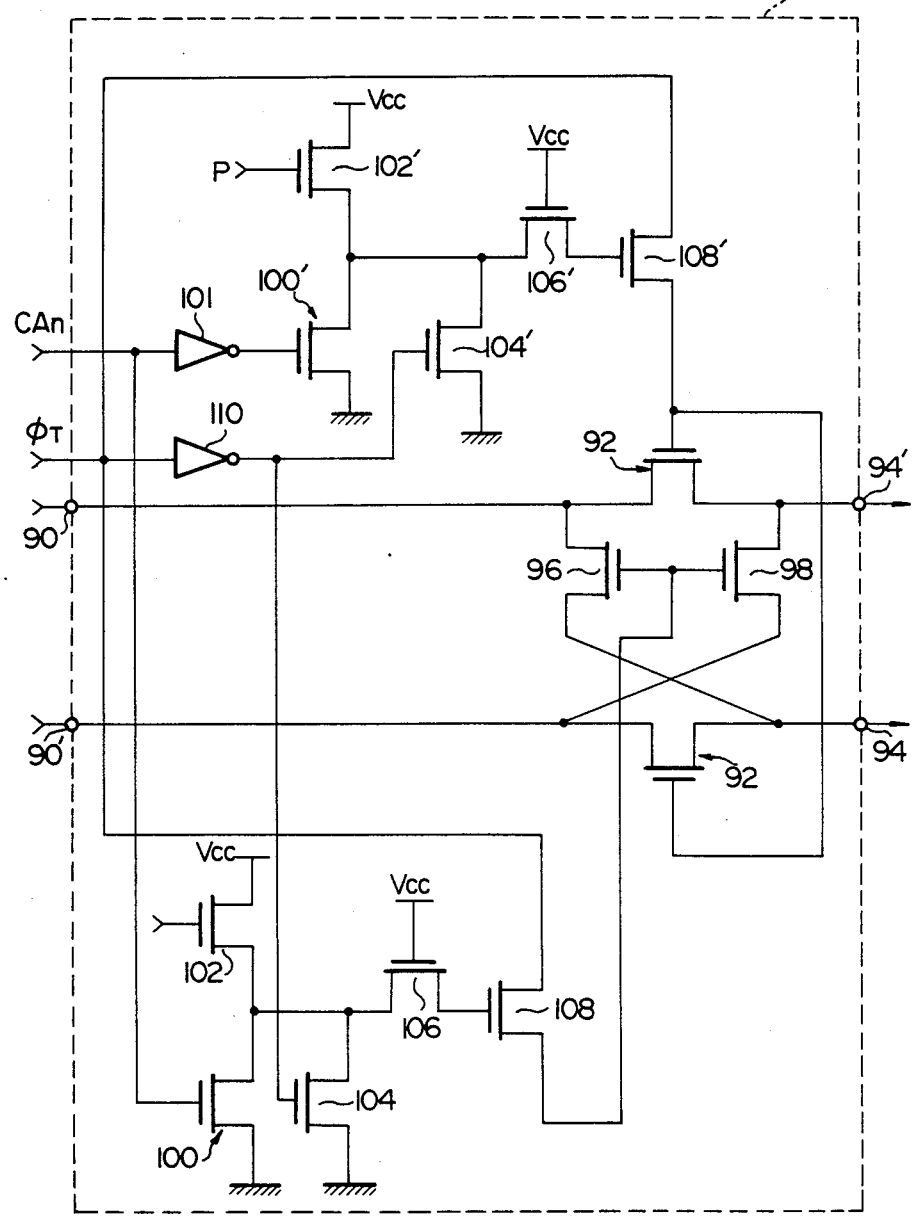
FIG. 4 is a circuit diagram showing a preferred example of one or each of data control circuits which further form part of the memory testing circuit illustrated in FIG. 1B.

On the other hand, FIG. 4 shows the circuit arrangement of each of the data control circuits 58, 60, 64 and 66 of the memory testing circuit shown in FIG. 1B. For purposes of description, however, the circuit arrangement herein shown is assumed to be of the first input data control circuit 58. As shown, the data control circuit 58 comprises two, first and second input terminals 90 and 90' one of which is connected directly to the first output terminal $TI_1$ of the above described test signal input control circuit 56 and the other of which is connected through an inverter (not shown) to the first output terminal $TI_1$ of the test signal input control circuit 56. Thus, signals complementary to each other are to appear on these two input terminals 90 and 90', respectively. These complementary first and second input terminals 90 and 90' are connected through source-drain paths of transistors 92 and 92' to first and second output terminals 94 and 94', respectively. One of the first and second output terminals 94 and 94' leads directly to the first data bus line $DB_1$ and the other leads to the data bus line $\overline{DB_1}$ through an inverter (Not shown). These transistors 92 and 92' form part of a differential network which further comprises two transistors 96 and 98 which have their gates connected together and their respective source-drain paths cross coupled between the first input terminal 90 and the second output terminal 94' and between the second input terminal 90' and the first output terminal 94 across the respective source-drain paths of the transistors 92 and 92'.

The data control circuit 58 shown in FIG. 4 further comprises a pair of transistors 100 and 100' one of which has its gate responsive directly to the second data bus line address signal $CA_n$ supplied from the address buffer 20 (FIG. 1C) of the memory device and the other of which has its gate responsive to the data bus line address signal $CA_n$ through an inverter 101 as shown. These transistors 100 and 100' have their source-drain paths connected each at one end to the source (the terminal 48 shown in FIG. 1C) of the high-level supply voltage $V_{cc}$ and at the other to ground (the terminal 50 shown in FIG. 1C). A node between the transistors 100 and 102 and a node between the transistors 100' and 102' are connected to ground through the source-drain paths of transistors 104 and 104', respectively, and are further connected through the source-drain paths of load transistors 106 and 106' to the gates of transistors 108 and 108', respectively. The transistors 104 and 104' have their gates connected through a common inverter 110 to the output terminal of the test control signal generator 52 (FIG. 2) and thus responsive through the inverter 110 to the test control signal $\phi_T$ supplied from the signal generator 52. To the gate of each of the load transistors 106 and 106' is applied the high-level supply voltage $V_{cc}$. Of the remaining two transistors 108 and 108', one transistor 180 has its source-drain path responsive at one end to the test control signal $\phi_T$ and connected at the other commonly to the respective gates of the transistors 92 and 92' forming part of the differential network. The other transistor 108' has its source-drain path also responsive at one end to the test control signal $\phi_T$ and connected at the other commonly to the respective gates of the transistors 986 and 98 forming part of the differential network. Each of the transistors 102 and 102' is a precharge transistor which is to receive a control signal of high level at its gate and is thus coupled to the high-level supply voltage $V_{cc}$ to precharge the node among the transistors 100, 104 and 106 or transistors 100', 104' and 106' upon termination of each write/read cycle of testing operation of the device. During each write/rear cycle of testing operation, each of the precharge transistors 102 and 102' is maintained in a non-conduction state.

In conjunction with the data control circuit 58 constructed and arranged as hereinbefore described, the address buffer 20 (FIG. 1C) responsive to the incoming address signal $A_0 \ldots A_n$ is designed such that the second data bus line address signal $CA_n$ produced from the address signal $A_0 \ldots A_n$ selectively has either a low level or a high level.

When, now, the test control signal $\phi_T$ of high level is supplied from the test control signal generator 52, each of the transistors 104 and 104' is maintained in non-conduction state through the inverter 110. If, in this instance, the second data bus line address signal $CA_n$ from the address buffer 20 assumes a high level, the transistor 100 is turned on and the transistor 100' is maintained in non-conduction state through the inverter 101. The precharge voltage which has been present at the node between the transistors 100, 104 and 106 is released to ground through the transistor 100 so that a voltage of low level is applied through the source-drain path of the transistor 106 to the transistor 108. The transistor 108 thus remains non-conductive with the result that a voltage of low level is applied to the gate of each of the transistors 96 and 98. With both of the transistors 100' and 104' maintained non-conductive, on the other hand, the precharge voltage of high level as established at the node between the transistors 100', 104' and 106' is applied through the source-drain path of the transistor 106' to the gate of the transistor 108'. The transistor 108' is thus activated to turn on and in turn, activates both of the transistors 92 and 92' with the test control signal $\phi_T$ of high level. Under these conditions, the complementary signals appearing on the first and second input terminals 90 and 90' are passed through the transistors 92 and 92' to the first and second output terminals 94 and 94', respectively. Thus, when the second data bus line address signal CA$_n$ is at high level, the mutually complementary signals appearing at the first and second input terminals 90 and 90' are passed through the transistors 98 and 96 to the first and second output terminals 94 and 94', respectively. The signal thus appearing on one of the two output terminals 94 and 94' is transmitted directly and the signal appearing on the other output terminal is transmitted through an inverter (not shown) to the first data bus line DB$_1$ (FIGS. 1A to 1C). In this fashion, the data signal appearing on the first output terminal TI$_1$ of the test signal input control circuit 56 is without modification or inversion passed through the first input data control circuit 58 to the first data bus line DB$_1$. In a like manner, the data signal appearing on the third output terminal TI$_3$ of the test signal input control circuit 56 is without modification or inversion passed through the second input data control circuit 60 to the third data bus line DB$_3$. The data signals appearing on the second and fourth output terminals TI$_2$ and TI$_4$ of the test signal input control circuit 56 are passed directly and without modification to the second and fourth data bus lines DB$_2$ and DB$_4$, respectively. Accordingly, there are identical data signals appearing on all of the first to fourth data bus lines DB$_1$ and DB$_4$.

In the presence, on the other hand, of the second data bus line address signal CA$_n$ of low level, the transistor 100 remains turned off and the transistor 100' is turned on through the inverter 101 with the transistor 104' maintained in non-conduction state through the inverter 110. It therefore follows that the node among the transistors 100', 104' and 106' is connected to ground through the transistor 100' so that a voltage of low level is applied to the gate of the transistor 108' through the source-drain path of the transistor 106'. The transistor 108' thus remains in non-conduction state and accordingly both of the transistors 92 and 92' also remain in non-conduction state. The test control signal $\phi_T$ being at high level, the transistor 104 remains non-conductive through the inverter 110 so that the pre-charge voltage of high level established at the node between the transistors 100, 104 and 106 upon termination of the preceding cycle of operation is maintained with the transistor 100 turned off. The precharge voltage of high level is passed through the source-drain path of the transistor 106 and is applied to the gate of the transistor 108 and activates the transistor 108 to turn on. The test control signal $\phi_T$ of high level is passed through the source-drain path of the transistor 108 to the gate of each of the transistors 96 and 98 also forming part of the differential network. The transistors 96 and 98 being turned on, the first input terminal 90 is connected to the second output terminal 94' through the transistor 98 and the second input terminal 90' is connected to the first output terminal 94 through the transistor 96. Thus, when the second data bus line address signal CA$_n$ is at low level, the mutually complementary signals appearing at the first and second input terminals 90 and 90' are passed through the transistors 98 and 96 to the second and first output terminals 94' and 94, respectively. The signal thus appearing on one of the two output terminals 94 and 94' is transmitted directly and the signal appearing on the other output terminal is transmitted through the inverter (not shown) to the first data bus line DB$_1$. In this fashion, a logically inverted version of the data signal appearing on the first output terminal TI$_1$ of the test signal input control circuit 56 is passed through the first input data control circuit 58 to the first data bus line DB$_1$. In a like manner, a logically inverted version of the data signal appearing on the third output terminal TI$_3$ of the test signal input control circuit 56 is passed through the second input data control circuit 60 to the third data bus line DB$_3$. The data signals appearing on the second and fourth output terminals TI$_2$ and TI$_4$ of the test signal input control circuit 56 are passed directly and without modification to the second and fourth data bus lines DB$_2$ and DB$_4$, respectively. Accordingly, there are alternately complementary data signals appearing on the first to fourth data bus lines DB$_1$ and DB$_4$.

The circuit arrangement of each of the first and second output data control circuits 64 and 66 in the memory testing circuit shown in FIG. 1B is largely similar to the circuit 58 hereinbefore described with reference to FIG. 4. In the case of each of these data control circuits 64 and 66, however, the input terminals 90 and 90' of the data control circuit 56 are to be used as output terminals, respectively, and the output terminals 94 and 94' of the data control circuit 56 are to be used as input terminals, respectively. It will be readily understood from the foregoing description that, by means of such a modified form of data control circuit, the data signal input from the first data bus line DB$_1$ to the first output data control circuit 64 or from the third DB$_3$ to the second output data control circuit 66 is logically inverted by means of the data control circuit 64 or 66, respectively, before being passed over to the test signal output control circuit 62. To the first and second output data control circuits 64 and 66 are respectively supplied the data signals representative of the pieces of data read from any two of the memory cells of the cell blocks 10a and 10b. These data signals must be respectively identical with the test data signals which have once been written into the particular two memory cells from the first and second input data control circuits 58 and 60, respectively, unless the data written into each of the two memory cells has been destroyed during storage of the data. Such data signals read from the memory cells are inverted by the first and second output data control circuits 64 and 66 and thus result in signals respectively identical with those which have been output from the test signal input control circuit 56 to the first and second input data control circuits 58 and 60, respectively.

Figure 5:
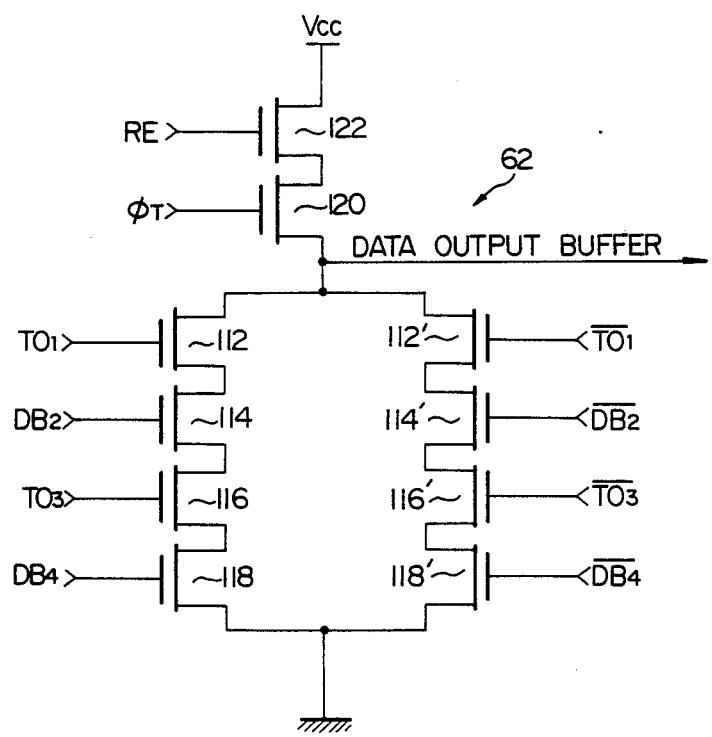
FIG. 5 is a circuit diagram showing a preferred example of a test signal output control circuit which further forms part of the memory testing circuit illustrated in FIG. 1B.

In FIG. 5 is shown the circuit arrangement of the test signal output control circuit 62 forming part of the memory testing circuit shown in FIG. 1B. The test signal output control circuit 62 comprises a first series combination of first to fourth transistors 112, 114, 116 and 118 and a second series combination of first to fourth transistors 112', 114', 116' and 118'. These first series of transistors 112 to 118 and second series combination of transistors 112' to 118' are connected in parallel between the source (the terminal 48 shown in FIG. 1C) of the high-level supply voltage V$_{cc}$ and the source (the terminal 50 shown in FIG. 1C) of the ground voltage. Between the high-level voltage source and the parallel circuit is provided a series combination of transistors 120 and 122 with an output terminal of the resultant network formed at a node between the parallel circuit and the series combination of the transistors 120 and 122. The transistor 120 has its gate responsive to the test control signal $\phi_T$ and is thus activated to turn on during testing operation. The transistor 122 has its gate responsive to the read control signal RE and is thus activated to turn on during each read cycle of testing operation.

In the parallel circuit of the transistors, one of the first and fifth transistors 112 and 112' has its gate responsive to the signal on the first input terminal $TO_1$ of the test signal input control circuit 62 and the other has its gate responsive to an inverted version of the signal on the terminal $TO_1$. One of the second and sixth transistors 114 and 114' has its gate responsive to the signal on the second input terminal $TO_2$ of the test signal input control circuit 62, viz., on the second data bus line $DB_2$ and the other has its gate responsive to an inverted version of the signal on the data bus line $DB_2$ and terminal $TO_2$. One of the third and seventh transistors 116 and 116' has its gate responsive to the signal on the third input terminal $TO_3$ of the test signal input control circuit 62 and the other has its gate responsive to an inverted version of the signal on the terminal $TO_3$. One of the fourth and eighth transistors 118 and 118' has its gate responsive to the signal on the fourth input terminal $TO_4$ of the test signal input control circuit 62, viz., on the fourth data bus line $DB_4$ and the other has its gate responsive to an inverted version of the signal on the data bus line $DB_4$ and terminal $TO_4$. Each of the first and second series combination of transistors arranged in this manner forms a logic NAND gate circuit. Thus, when the data signals on all the first to fourth input terminals $T_1$ to $T_4$ of the test signal output control circuit 62 are of high levels, the first to fourth transistors 112 to 118 are turned on so that the circuit 62 has a low level at its output terminal. If the data signal on at least one of the input terminals $T_1$ to $T_4$ of the test signal output control circuit 62 is of a low level, then the series circuit of the transistors 112 to 118 is blocked so that the circuit 62 has a high level at its output terminal with the transistors 120 and 122 turned on during read cycle of testing operation. Likewise, when the data signals on all the first to fourth input terminals $TO_1$ to $TO_4$ of the test signal output control circuit 62 are of low levels, the fifth to eighth transistors 112' to 118' are turned on so that the circuit 62 has a low level at its output terminal. If the data signal on at least one of the input terminals $TO_1$ to $TO_4$ of the test signal output control circuit 62 is of a low level, then the series circuit of the transistors 112' to 118' is blocked so that the circuit 62 has a high level at its output terminal with the transistors 120 and 122 turned on during read cycle of testing operation. As previously noted, the data signals to appear on the first to fourth input terminals $TO_1$ to $TO_4$ of the test signal output control circuit 62 must be of the levels identical to those of the data signals which appeared at the first to fourth output terminals $TI_1$ to $TI_4$ of the test signal input control circuit 56 unless the pieces of data resulting from the data signals originating in the test signal input control circuit 56 have been destroyed in the memory cells into which the pieces of data were written. In addition, all the data signals to appear at the first to fourth output terminals $TI_1$ to $TI_4$ of the test signal input control circuit 56 have identical levels which may be either low or high and which are herein assumed to be high. Accordingly, the first NAND gate circuit composed of the transistors 112 to 118 is operative to produce a voltage of low level at the output terminal of the circuit 62 insofar as the pieces of data which were written into and read from the memory cells have not been destroyed during storage within the cells. If the data written into a memory cell through one of the four data bus lines $DB_1$ to $DB_4$ has happened to be destroyed during storage in the cell, then one of the transistors 112 to 118 of the first NAND gate circuit is turned off so that there appears a voltage of high level at the output terminal of the circuit 62, showing that there has been an interference due to capacitive coupling between the particular cell and the cell located adjacent the cell in question.

Description will now be made with concurrent reference to FIGS. 1A to 1C and FIGS. 2 to 5 in regard to the general aspect of operation of the memory device incorporating the memory testing circuit composed of the circuit components each constructed and arranged as hereinbefore described.

A testing mode of operation is established with the test enable signal TE with a level higher than the supply voltage $V_{cc}$ supplied to the test enable terminal 54 of the chip (FIG. 1B). During testing mode of operation, the n-bit address signal $A_0 \ldots A_n$ appears at the terminal 18 twice during each of the write and read cycles as during ordinary write/read mode of operation of the device. Upon receipt of this the address signal $A_0 \ldots A_n$, the address buffer 20 produces a row address signal $RA_0 \ldots RA_{n-1}$ and an n+2th column address bit $CA_{n+1}$ in response to the first address latch signal 1AL generated with the row address strobe signal RAS_ swung to low level. This row address signal $RA_0 \ldots RA_{n-1}$ is composed of an n number of bits resulting respectively from the bits $A_0$ to $A_n$ of the input address signal $A_0 \ldots A_n$ and the n+2th column address bit $CA_{n+1}$ results from the remaining least significant bit $A_n$ of the input address signal $A_0 \ldots A_n$. The row address signal $RA_0 \ldots RA_{n-1}$ thus output from the address buffer 20 is transferred to the first and second row address decoders 12a and 12b, while the n+2th column address bit $CA_{n+1}$ resulting from the bit $A_n$ of the input address signal $A_0 \ldots A_n$ is latched within the address buffer 20. On the other hand, in response to the second address latch signal 2AL generated with the column address strobe signal CAS_ swung to low level, the address buffer 20 produces an n+1 number of column address bits $CA_0$ to $CA_n$ resulting respectively from the bits $A_0$ to $A_n$ of the input address signal. Of these column address bits $CA_0$ to $CA_n$, an n number of address bits $CA_0$ to $CA_{n-1}$ are supplied as a column address signal $CA_0 \ldots CA_{n-1}$ to the column address decoder 14. In response to the row address signal $RA_0 \ldots RA_{n-1}$ thus supplied to the row address decoders 12a and 12b and to the column address signal $CA_0 \ldots CA_{n-1}$ supplied to the column address decoder 14, the address decoders 12a, 12b and 14 connect two of the memory cells of the first cell block 10a to the first and second data bus lines $DB_1$ and $DB_2$, respectively, and two of the memory cells of the second cell block 10b to the third and fourth data bus lines $DB_3$ and $DB_4$, respectively. The bit $CA_{n+1}$ resulting from the remaining least significant bit $A_n$ of the input address signal $A_0 \ldots A_n$ appearing in the presence of the first address latch signal 1AL and the bit $CA_n$ resulting from the remaining least significant bit $A_n$ of the input address signal $A_0 \ldots A_n$ appearing in the presence of the second address latch signal 2AL are supplied to each of the data write and read control circuits 32 and 34 also during testing mode of operation. During testing mode of operation, however, the data write and read control circuits 32 and 34 are maintained inoperative in the presence of the test control signal $\phi_T$ of high level with the test enable signal TE of high level (which is herein assumed to be higher than 12 volts) established at the test enable terminal 54. The first and second data bus address signals provided by the bits $CA_{n+1}$ and $CA_n$, respectively, are thus left unused for the addressing of memory cells during testing mode of operation.

In response to the test enable signal TE of high level as appearing at the test enable terminal 54, the test control signal generator 52 produces the test control signal $\phi_T$ of high level. The test control signal $\phi_T$ is, upon being inverted, supplied to the fourth control terminal of each of the data write and read control circuits 32 and 34 (FIG. 1C) and thereby disables each of these control circuits 32 and 34. It may be noted that the test enable signal TE appearing at the terminal 54 has a low level during ordinary read/write cycle of operation when the test control signal $\phi_T$ also has a low level to maintain the test signal input and output control circuits 56 and 62 and each of the data control circuits 58, 60, 64 and 66 remains inoperative.

During the testing mode of operation, the selection of memory cells for each write/read cycle is performed as during ordinary write/read operation of the device. Thus, the word lines such as for example the word lines $W_{11}$ and $W_{21}$ are selected from the first and second cell blocks 10a and 10b by means of the first and second row address decoders 12a and 12b, respectively (FIG. 1A). On the other hand, a bit line select signal such as the bit line select signal $CS_1$ of high level is supplied from the column address decoder 14 to the control terminals of the bit line selector switches $S_{11}$, $S_{12}$, $S_{21}$ and $S_{20}$ and activate these switches to close. The result is that the memory cells $C_{111}$, $C_{121}$, $C_{211}$ and $C_{221}$ common to the bit lines $D_{11}$, $D_{12}$, $D_{21}$ and $D_{20}$ and word lines $W_{11}$ and $W_{21}$ are connected to the first to fourth data bus lines $DB_1$, $DB_2$, $DB_3$ and $DB_4$, respectively. On the other hand, the write enable signal W— appearing at the write enable terminal 46 (FIG. 1C) is swung to low level to cause the timing signal generator 40 to produce the write control signal WE of high level for enabling the writing of test data. In the presence of the test control signal $\phi_T$ and write control signal WE of high levels, the test signal input control circuit 56 is enabled to produce test signals of high levels at its four output terminals $TI_1$ to $TI_4$ in response to the test data signal $D_{IN}$ of high level supplied to the data input terminal 28 of the chip.

In the memory device incorporating the testing circuit embodying the present invention, the least significant bit $A_n$ of the address signal $A_0 \ldots A_n$ to appear at the address input terminals 18 of the chip assumes a low level and accordingly the second data bus line address signal $CA_n$ resulting from the bit $A_n$ also assumes a low level in the presence of the active-low column address strobe signal CAS— of low level during testing mode of operation. With the second data bus line address signal $CA_n$ from the address buffer 20 thus maintained at low level, the test data signal thus appearing at the first and third output terminals $TI_1$ and $TI_3$ of the test signal input control circuit 56 are inverted by means of the first and second data control circuits 58 and 60, respectively, as described with reference to FIG. 4. It therefore follows that test data signals of high, low, high and low levels appear on the first, second, third and fourth data bus lines $DB_1$, $DB_2$, $DB_3$ and $DB_4$, respectively, and are passed by way of these data bus lines and through the bit line selector switches $S_{11}$, $S_{12}$, $S_{21}$ and $S_{20}$ to the selected memory cells $C_{111}$, $C_{121}$, $C_{211}$ and $C_{221}$, respectively. In this fashion, alternately distinct or opposite pieces of data are written simultaneously into the four memory cells $C_{111}$, $C_{121}$, $C_{211}$ and $C_{221}$ through the single data input terminal 28. Upon termination of the write cycle, the row and column address strobe signals RAS— and CAS— and write enable signal $W_{13}$ supplied to the timing signal generator 40 swing to high levels to reset the memory device for precharge operation.

Assume now that the column addresses designated by the column address decoder 14 are changed by ones during the subsequent test data write cycle of the testing mode of operation so that the bit line select signal $CS_2$ is output from the decoder 14 with the word lines $W_{11}$ and $W_{21}$ invariably selected by the row address decoders 12a and 12b. In this instance, the memory cells $C_{131}$ and $C_{141}$ are selected from the first cell block 10a through the switches $S_{13}$ and $S_{14}$, respectively, and the memory cells $C_{231}$ and $C_{241}$ selected from the second cell block 10b through the switches $S_{23}$ and $S_{24}$, respectively. Data signals of alternately distinct or opposite levels are thus written simultaneously into the four memory cells $C_{131}$, $C_{141}$, $C_{231}$ and $C_{241}$ through the data bus lines $DB_1$, $DB_2$, $DB_3$ and $DB_4$, respectively.

It is then assumed that, during the next data write cycle, the row addresses respectively designated by the row address decoders 12a and 12b are changed by ones so that the word lines $W_{12}$ and $W_{20}$ with the bit lines $D_{11}$ and $D_{21}$ selected by the column address decoder 14. In this instance, the memory cells $C_{112}$ and $C_{122}$ are selected from the first cell block 10a through the switches $S_{11}$ and $S_{12}$, respectively, and the memory cells $C_{212}$ and $C_{222}$ selected from the second block 10b through the switches $S_{21}$ and $S_{20}$, respectively. Data signals of alternately distinct or opposite levels are thus written simultaneously into the four memory cells $C_{112}$, $C_{122}$, $C_{212}$ and $C_{222}$ through the data bus lines $DB_l$, $DB_2$, $DB_3$ and $DB_4$, respectively. In these manners, data can be written into all the memory cells of the first and second memory cell blocks 10a and 10b with alternately distinct or opposite pieces of data stored into the adjacent memory cells.

For the reading of the data thus written into the memory array, the write enable signal W— appearing at the terminal 46 of the chip swings to high level with the result that the write control signal WE supplied from the signal generator 40 swings to low level. In the presence of the write control signal WE of low level, each of the output terminals $TI_1$ to $TI_4$ of the circuit sections 56a to 56d of the test signal input control circuit 56 (FIG. 3) is maintained in a high impedance state as previously described with reference to FIG. 3. Assumed to be selected in the cell blocks 10a and 10b are the memory cells $C_{111}$, $C_{121}$, $C_{211}$ and $C_{221}$ with the word lines $W_{11}$ and $W_{21}$ selected by the row address decoders 12a and 12b, respectively, and with the bit lines $D_{11}$, $D_{12}$, $D_{21}$ and $D_{20}$ selected by the column address decoder 14. The four memory cells $C_{111}$, $C_{121}$, $C_{211}$ and $C_{221}$ thus accessed are connected to the data bus lines $DB_1$, $DB_2$, $DB_3$ and $DB_4$ through the switches $S_{11}$, $S_{12}$, $S_{21}$ and $S_{20}$, respectively.

By the transition of the write enable signal W— to high level, the read control signal RE from the timing signal generator 40 swings to low level to high level and activates the test signal output control circuit 62 in the presence of the test control signal $\phi_T$ of high level. In the test signal output control circuit 62 shown in FIG. 5, the transistors 120 and 122 are now turned on so that, if the pieces of data written into the selected four memory cells $C_{111}$, $C_{121}$, $C_{211}$ and $C_{221}$ remain sound, the first NAND gate circuit composed of the series combination of the transistors 112 to 118 becomes conductive to produce a voltage of ground level at the output terminal of the test signal output control circuit 62. If the data read from at least one of the memory cells $C_{111}$, $C_{121}$, $C_{211}$ and $C_{221}$ has been destroyed during storage and accordingly the data signal representative of the particular data has a low level, at least one of the transistors 112 to 118 remains in non-conduction state so that there appears a voltage approximating the high-level supply voltage $V_{cc}$ through the transistors 120 and 122. If test data signals of low levels are output from the output terminals $TI_1$ to $TI_4$ of the test signal input control circuit 56 (FIG. 3) in response to the input data signal $D_{IN}$ of low level, the second NAND gate circuit composed of the series combination of the transistors 112' to 118' becomes conductive to produce a voltage of ground level at the output terminal of the test signal output control circuit 62 if the pieces of data read from the memory cells $C_{111}$, $C_{121}$, $C_{211}$ and $C_{221}$ remain sound. On the other hand, if the data read from at least one of the memory cells $C_{111}$, $C_{121}$, $C_{211}$ and $C_{221}$ has been destroyed during storage and accordingly the data signal representative of the particular data has a high level, at least one of the transistors 112' to 118' remains in non-conduction state so that there also appears a voltage approximating the high-level supply voltage $V_{cc}$ through the transistors 120 and 122. The voltage approximating either the high-level supply voltage $V_{cc}$ or low-level or ground voltage thus appearing at the output terminal of the control circuit 62 is passed through the data output buffer 36 and is output from the memory device as the output data signal $D_{OUT}$ through the data output terminal 38 of the chip.

As will have been seen from the foregoing description, a memory testing circuit according to the present invention is advantageous for use specifically in a semiconductor read/write memory device in which two or more data lines such as the data bus lines $DB_1$ to $DB_4$ are arranged in association with a single data input or output terminal such as the data input terminal 28 and data write control means such as the data input buffer 30 and data write control circuit 32 by which data is to be written into the memory cell array during ordinary data write cycle of operation. The memory testing circuit is characterized in that such data write control means 30/32 is de-activated or disabled in response to the test control signal $\phi_T$ so that true test data is supplied to one of adjacent two memory cells through one of the two or more data bus lines $DB_1$ to $DB_4$ and complementary test data is supplied to another cell through another data bus line. Furthermore, selectively either identical or alternately distinct pieces of data may be written into the adjacent two of the plurality of memory cells into which data is to be written during each write cycle. Identical pieces of data can be written into the cells by the use of the second data bus line address signal $CA_n$ of high level in each of the first and second input data control circuits 58 and 60 and first and second output data control circuits 64 and 66. Alternately distinct or opposite pieces of data can be written into the cells by the use of the second data bus line address signal $CA_n$ of low level in each of the input data control circuits 58 and 60 and output data control circuits 64 and 66. While it has been assumed that the second data bus line address signal $CA_n$ supplied from the address buffer 20 is used as the data bus line address signal to be used in each of these data control circuits 58, 60, 64 and 66, the first data bus line address signal $CA_{n+1}$ supplied from the address buffer 20 may if desired be used in substitution of the second data bus line address signal $CA_{n-1}$. While, furthermore, four data bus lines are used in the embodiment hereinbefore described, two or more than four data bus lines may be used in a memory testing circuit according to the present invention, one half of the data bus lines being provided in association with one of the cell blocks and the other half of the data bus lines being provided in association with the other cell block. If desired, furthermore, a memory testing circuit according to the present invention may be embodied with the bit lines and the column address decoder of the described embodiment exchanged with the word lines and the row address decoders of the embodiment. It may also be noted that the test data written into the memory cells may be read out through use of the parallel address input terminals 18 so that the pieces of data respectively read from a plurality of memory cells associated with the plurality of data bus lines are output separately through the terminals 18. While, on the other hand, each of the bit lines and data bus lines has been assumed to consist of a single line, such a line may consist of a pair of lines complementary to each other as in a memory device of the folded-bit-line design. In this instance, the inverter (not shown) which has been described as being connected to one of the two input terminals of each of the data control circuits 58, 60, 64 and 66 and the test signal output control circuit 62 may be dispensed with.

What is claimed is:

1. A semiconductor memory device comprising:
   (a) a memory cell array consisting of a number of memory cells arranged in rows and columns,
   (b) at least two data bus lines operatively connected to said memory cell array,
   (c) first selector means responsive to a portion of a supplied address signal for selecting at least two of the memory cells from said memory cell array and coupling the selected at least two memory cells respectively to said at least two data bus lines,
   (d) second selector means connected to said at least two data bus lines and to a data input terminal to receive supplied input data, the second selector means being responsive to the remaining portion of the supplied address signal for selecting one of said at least two data bus lines and supplying to the selected single data bus line the data to be written into the memory cell which is selected from the selected at least two memory cell and which is connected to the selected single data bus line, and
   (e) a memory testing circuit connected to said at least two data bus lines and said data input terminal and responsive to the data supplied through said data input terminal to supply test data to each of said at least two selected data bus lines for writing the test data concurrently into said at least two selected memory cells of said memory cell array without relying on said second selector means.

2. A memory testing circuit as set forth in claim 1, further comprising:
   (f) test control signal generating means responsive to a supplied test enable signal to produce a test control signal, said second selector means being de-activated in response to the test control signal,
   (g) a test signal input control circuit associated with two of said data bus lines and responsive to said test control signal for producing at least two identical output signals, one of the two identical output signals being transmitted directly to one of said two data bus lines, (h) at least one input data control circuit operative to produce one of two different states in response to said test control signal, the two different states consisting of a first state operative to simply pass therethrough the other of said at least two identical output signals from said test signal input control circuit to the other of said two data bus lines for storage of identical pieces of data respectively into selected two of the memory cells in said memory cell array and a second state operative to invert said other of said at least two identical output signals to said other of said two data bus lines for storage of distinct pieces of data respectively into selected two of the memory cells in said memory cell array, (i) at least one output data control circuit operative to produce one of two different states in response to said test control signal, the two different states of the output data control circuit consisting of a first state operative to simply pass therethrough the data signal on one of said two data bus lines and a second state operative to invert the data signal on said one of said two data bus lines, and (j) a test signal output control circuit associated with said two data bus lines and responsive to the data signal on said one of said two data bus lines and the signal output from said output data control circuit for producing an output signal of one level in response to input signals with identical levels and an output signal of another level in response to input signals including at least one input signal with a level different from the levels of the remaining input signals.

3. A memory testing circuit as set forth in claim 2, in which said input data control circuit is provided in association with a source of high-level voltage and a source of low-level voltage and comprises first and second input terminals one of which is responsive directly to one of the output signals from said test signal input control circuit and the other of which is responsive to said one of the output signals from said test signal input control circuit through an inverter, first and second output terminals one of which is connected directly to one of said two data bus lines and the other one of which is connected to said one of said two data bus lines through an inverter, a first pair of transistors one of which has its current path connected between the first input terminal and the first output terminal and the other of which has its current path connected between the second input terminal and the second output terminal, each of the first pair of transistors having a control terminal, a second pair of transistors one of which has its current path connected between the first input terminal and the second output terminal and the other of which has its current path connected between the second input terminal and the first output terminal, each of the second pair of transistors having a control terminal, a third pair of transistors each of which has its current path connected between said source of high-level voltage and said source of low-level voltage, one of the third pair of transistors having a control terminal responsive directly to a data bus line address signal to be predominant over the selection between said two different states of said test signal input control circuit and the other of said third pair of transistors having a control terminal responsive to said data bus line address signal through an inverter, a fourth pair of transistors each of which has its current path connected between said source of high-level voltage and said source of low-level voltage and further has a control terminal responsive to said test control signal through an inverter, one of the third pair of transistors and one of the fourth pair of transistors having therebetween a first common node through which the current path of each of the two transistors is connected to said source of high-level voltage and the other of the third pair of transistors and the other of the fourth pair of transistors having therebetween a second common node through which the current path of each of the two transistors is connected to said source of high-level voltage, a fifth pair of transistors one of which has a control terminal connected to said first common node and a current path connected at one end to the respective control terminals of said first pair of transistors and responsive at the other to said test control signal, the other of said fifth pair of transistors having a control terminal connected to said second common node and a current path connected at one end to the respective control terminals of said second pair of transistors and responsive at the other to said test control signal.

4. A semiconductor memory device as set forth in claim 1, in which said memory testing circuit comprises:
(e/1) means operative to output as said test data the data supplied through said data input terminal and supply the test data to one of said at least two selected data bus lines, and
(e/2) means responsive to said remaining portion of said supplied address signal to output as said test data an inverted version of the data supplied through said data input terminal and supply the test data to the other of said at least two selected data bus lines.

5. A semiconductor memory device as set forth in claim 4, in which said memory testing circuit is responsive to a supplied test enable signal to produce a test control signal and supply the test control signal to deactivate each of said second selector means.

6. A semiconductor memory device comprising:
(a) a memory cell array consisting of a number of memory cells arranged in rows and columns,
(b) at least two data bus lines operatively connected to said memory cell array,
(c) selector means responsive to a portion of a supplied address signal for selecting at least two of the memory cells from said memory cell array and coupling the selected at least two memory cells respectively to said at least two data bus lines,
(d) a data input terminal through which data is to be input to the memory device,
(e) a data output terminal through which data is to be output from the memory device,
(f) data write control means connected to said at least two data bus lines and to said data input terminal and responsive to the remaining portion of said supplied address signal during a data write cycle of operation of the memory device for selecting one of said at least two data bus lines and loading into the memory cell connected to the selected data bus line the data supplied through said data input terminal.

(g) data read control means connected to said at least two data bus lines and to said data output terminal and responsive to said remaining portion of said supplied address signal during a data read cycle of operation of the memory device for selecting one of said at least two data bus lines, fetching from the memory cell connected to the selected data bus line the data supplied through said data input terminal and supplying the fetched data to said data output terminal, (h) test data write control means connected to said at least two data bus lines and to said data input terminal and, during a test data write cycle of operation of the memory device, responsive to the data supplied through said data input terminal to supply test data to each of said at least two selected data bus lines for writing the test data concurrently into said at least two selected memory cells of said memory cell array, and (i) test data read control means connected to said at least two data bus lines and to said data input terminal and, during a test data read cycle of operation of the memory device, operative to fetch data concurrently from said at least two selected memory cells through said at least two data bus lines, producing an output signal indicating whether or not the fetched data is identical with the test data loaded into said at least two selected memory cells during said test data write cycle of operation, and supplying said output signal to said data output terminal.

7. A semiconductor memory device as set forth in claim 6, in which said test data write control means comprises means responsive to said remaining portion of said supplied address signal to output as said test data an inverted version of the data supplied through said data input terminal and supply the test data to at least one of said at least two selected data bus lines, said test data read control means being responsive to said remaining portion of said supplied address signal to invert the data appearing on at least one of said at least two selected data bus lines.

8. A semiconductor memory device comprising:
(a) a memory cell array consisting of a number of memory cell arranged in rows and columns,
(b) at least two data bus lines operatively connected to said memory cell array,
(c) selector means responsive to a portion of a supplied address signal for selecting at least two of the memory cells from said memory cell array and coupling the selected at least two memory cells respectively to said at least two data bus lines,
(d) a data input/output control circuit comprising:
  means responsive to the remaining portion of said supplied address signal for selecting one of said at least two data bus lines,
  means operative to load supplied data into the memory cell connected to the selected data bus line during a data write cycle of operation of the memory device, and
  means operative to fetch data from the memory cell connected to the selected data bus line during a data write cycle of operation of the memory device, and
(e) a testing circuit comprising
  means responsive to a test control signal for deactivating said data input/output control circuit,
  means operative to supply test data to each of said at least two data bus lines for loading the test data concurrently into said at least two selected memory cells when said test control signal designates a test data writing mode, and
  means operative to fetch test data concurrently from said at least two selected memory cells through said at least two data bus lines when said test control signal designates a test data reading mode.

* * * * *

UNITED STATES PATENT AND TRADEMARK OFFICE
CERTIFICATE OF CORRECTION

PATENT NO. : 4,888,772

DATED : December 19, 1989

INVENTOR(S) : Takaho Tanigawa

It is certified that error appears in the above-identified patent and that said Letters Patent is hereby corrected as shown below:

Column 4, line 27, after "$C_{212}$,", insert --...--.

Column 4, line 28, after "$C_{222}$,", insert --...--.

Column 4, line 29, after "$C_{232}$,", insert --...--.

Column 4, lines 55 and 56, after "odd-number bit", insert --lines $D_{11}$, $D_{13}$, ... of the first cell block 10a are connected.--

Column 6, line 4, delete "$CA_{n-1}$", and insert --$CA_{n+1}$--.

Column 6, line 13, delete "bis", and insert --bit--.

Column 6, line 14, delete "$CA_{n-1}$", and insert --$CA_{n+1}$--.

Column 6, line 16, delete "bis", and insert --bit--.

Column 6, line 20, delete "$CA_{n-1}$", and insert --$CA_{n+1}$--.

Column 6, line 66, delete "DB2", and insert --$DB_2$--.

Column 14, line 24, delete "rear", and insert --read--.

Column 16, line 35, delete "rear", and insert --read--.

Column 22, line 35, delete "DB2", and insert --$DB_2$--.

Signed and Sealed this

Fourteenth Day of May, 1991

*Attest:*

HARRY F. MANBECK, JR.

*Attesting Officer*     *Commissioner of Patents and Trademarks*